United States Patent
Silverbrook

(10) Patent No.: US 7,857,536 B2
(45) Date of Patent: *Dec. 28, 2010

(54) LOCKABLE PRINTER

(75) Inventor: Kia Silverbrook, Balmain (AU)

(73) Assignee: Silverbrook Research Pty Ltd, Balmain, New South Wales (AU)

(*) Notice: Subject to any disclaimer, the term of this patent is extended or adjusted under 35 U.S.C. 154(b) by 0 days.

This patent is subject to a terminal disclaimer.

(21) Appl. No.: 12/324,613

(22) Filed: Nov. 26, 2008

(65) Prior Publication Data

US 2009/0123211 A1 May 14, 2009

Related U.S. Application Data

(63) Continuation of application No. 11/713,660, filed on Mar. 5, 2007, now Pat. No. 7,467,903, which is a continuation of application No. 10/980,277, filed on Nov. 4, 2004, now Pat. No. 7,201,523, which is a continuation of application No. 10/636,281, filed on Aug. 8, 2003, now Pat. No. 6,971,313, which is a continuation of application No. 09/662,210, filed on Sep. 15, 2000, now Pat. No. 6,612,240.

(51) Int. Cl.
*B41J 29/02* (2006.01)

(52) U.S. Cl. .................. 400/693; 400/691; 347/108

(58) Field of Classification Search .................. 347/13, 347/20, 42, 85, 86, 87, 104, 108, 49; 400/691, 400/693; B41J 2/01, 2/00, 3/60, 29/00, 29/02
See application file for complete search history.

(56) References Cited

U.S. PATENT DOCUMENTS

| | | | |
|---|---|---|---|
| 4,116,620 A | 9/1978 | Stibbe | |
| 4,227,760 A * | 10/1980 | Witek, Jr. | 439/101 |
| 4,504,220 A | 3/1985 | Sunakawa et al. | |
| 4,555,717 A | 11/1985 | Miura et al. | |
| 5,356,229 A | 10/1994 | Hickman et al. | |
| 5,373,312 A | 12/1994 | Fujioka et al. | |
| 5,410,283 A | 4/1995 | Gooray et al. | |
| 5,502,464 A | 3/1996 | Takahashi et al. | |
| 5,528,271 A | 6/1996 | Ebisawa | |
| 5,534,897 A | 7/1996 | Anderson et al. | |
| 5,631,685 A | 5/1997 | Gooray et al. | |
| 5,812,153 A | 9/1998 | Watanabe et al. | |
| 5,939,206 A | 8/1999 | Kneezel et al. | |
| 5,963,770 A * | 10/1999 | Eakin | 399/364 |

(Continued)

FOREIGN PATENT DOCUMENTS

DE 2344227 A 3/1975

(Continued)

*Primary Examiner*—Judy Nguyen
*Assistant Examiner*—'Wyn' Q Ha

(57) ABSTRACT

A printer includes a housing. The housing surrounds a frame and defines a first set of locking formations. A print engine is housed within the housing. The print engine includes a pair of opposed print head assemblies for enabling double-sided printing to be effected upon print media passing there-between. A roller assembly is mounted within the housing. The roller assembly includes a drive roller and a driven roller to transport the print media between the opposed print head assemblies. A second set of locking formations extends from the housing and is configured to engage with the first set of locking formations of another printer so that the printers can be locked together.

4 Claims, 15 Drawing Sheets

U.S. PATENT DOCUMENTS

| | | | |
|---|---|---|---|
| 6,030,072 | A | 2/2000 | Silverbrook |
| 6,068,368 | A | 5/2000 | Lum et al. |
| 6,142,619 | A | 11/2000 | Miura et al. |
| 6,217,145 | B1 | 4/2001 | Ito et al. |
| 6,238,115 | B1 * | 5/2001 | Silverbrook et al. ........ 400/693 |
| 6,267,518 | B1 | 7/2001 | Abe |
| 6,293,196 | B1 | 9/2001 | DeMoore et al. |
| 6,308,626 | B1 | 10/2001 | Crystal et al. |
| 6,340,225 | B1 | 1/2002 | Szlucha |
| 6,386,535 | B1 | 5/2002 | Silverbrook |
| 6,398,344 | B1 | 6/2002 | Silverbrook |
| 6,398,438 | B1 | 6/2002 | Kim et al. |
| 6,447,113 | B1 | 9/2002 | Silverbrook |
| 6,820,959 | B1 | 11/2004 | Spitz et al. |
| 6,899,480 | B2 | 5/2005 | Silverbrook |
| 6,964,533 | B2 | 11/2005 | Silverbrook |
| 6,981,809 | B2 | 1/2006 | Silverbrook |
| 7,284,925 | B2 * | 10/2007 | Silverbrook ................ 400/693 |
| 2001/0040612 | A1 | 11/2001 | Shimizu |
| 2006/0033798 | A1 * | 2/2006 | Silverbrook ................ 347/108 |
| 2008/0012901 | A1 * | 1/2008 | Silverbrook .................. 347/49 |

FOREIGN PATENT DOCUMENTS

| | | | |
|---|---|---|---|
| DE | 19629072 A | | 1/1998 |
| JP | 50-17126 | | 6/1975 |
| JP | 62-40260 | | 2/1987 |
| JP | 04175176 A | * | 6/1992 |
| JP | 07-314825 | | 12/1995 |
| JP | 07-323533 | | 12/1995 |
| JP | 07-323533 A | | 12/1995 |
| JP | 08-072361 | | 3/1996 |
| JP | 08-174941 | | 7/1996 |
| JP | 08174852 A | * | 7/1996 |
| JP | 08-323959 A | | 12/1996 |
| JP | 09123431 A | * | 5/1997 |
| JP | 10207575 A | * | 8/1998 |

* cited by examiner

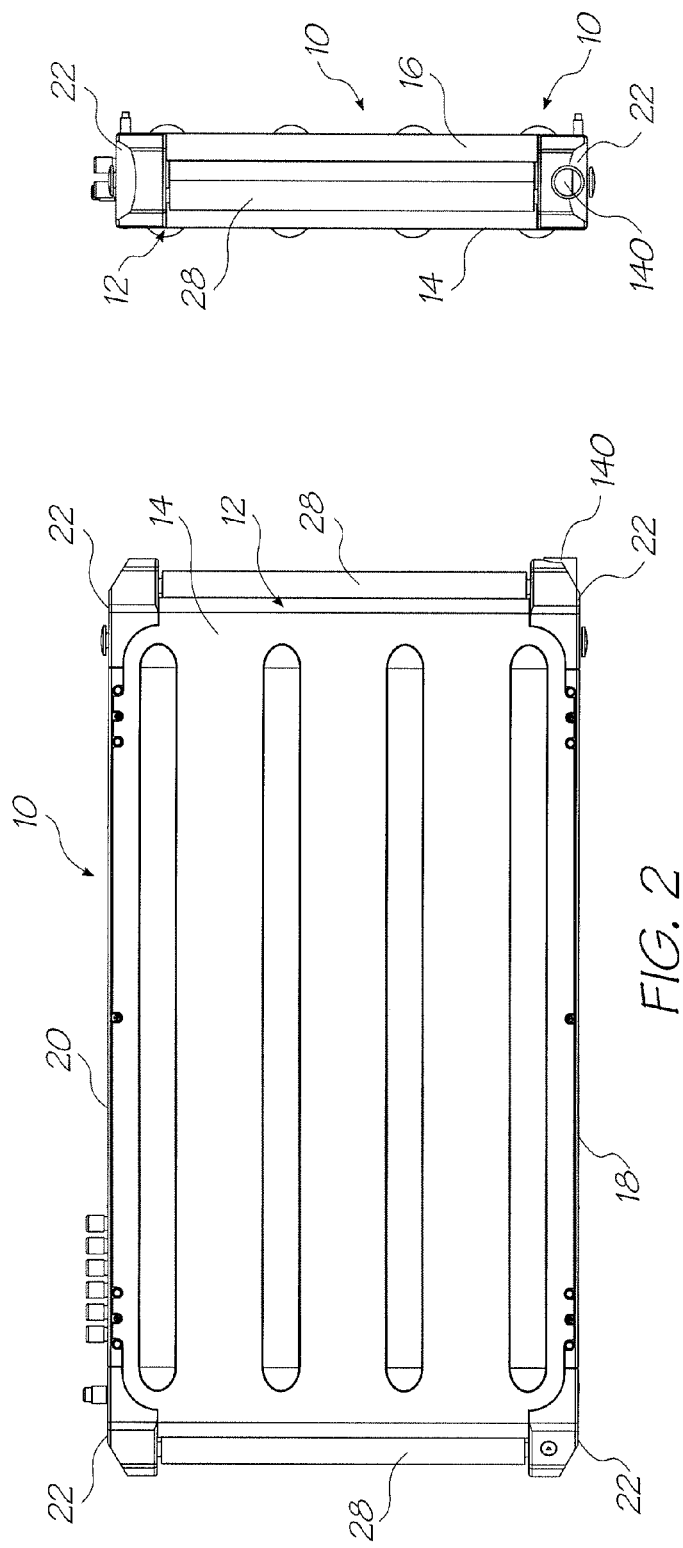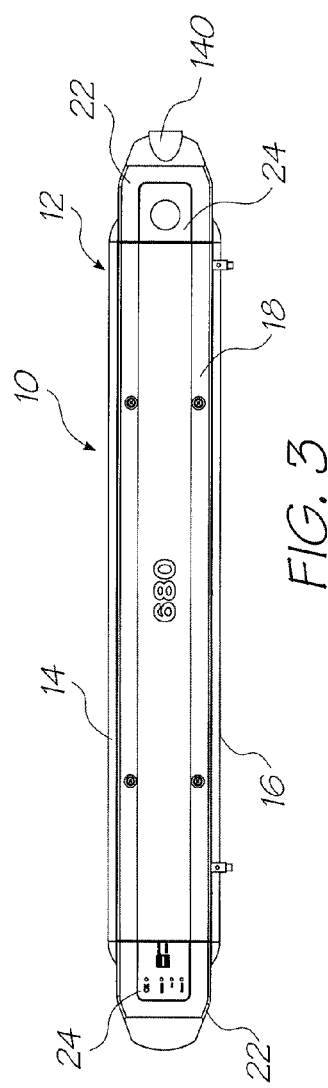

LOCKABLE PRINTER

CROSS REFERENCE TABLE

The present application is a Continuation Application of U.S. patent application Ser. No. 11/713,660 filed on Mar. 5, 2007, now issued U.S. Pat. No. 7,467,903, which is a continuation of U.S. application Ser. No. 10/980,277 filed on Nov. 4, 2004, now issued U.S. Pat. No. 7,201,523, which is a continuation application of U.S. application Ser. No. 10/636,281 filed Aug. 8, 2003, now issued U.S. Pat. No. 6,971,313, which is a continuation of U.S. application Ser. No. 09/662,210 filed on Sep. 15, 2000, now issued U.S. Pat. No. 6,612,240, all of which are herein incorporated by reference.

FIELD OF THE INVENTION

This invention relates to a modular printer. The invention relates particularly, but not necessarily exclusively, to a modular commercial printer for effecting high speed, digital, photographic quality, commercial printing. The invention relates specifically to drying equipment for a printer for aiding drying of a printed image on a web of print media.

BACKGROUND TO THE INVENTION

In high speed printing, large printing presses are daisy-chained together to print predetermined pages of publications which are then secured together to form the publications. Such printing presses occupy an extremely large volume and are very expensive.

The applicant has also proposed a commercial printer using a number of floor mounted printers having pagewidth print heads. This commercial printer is intended for extremely high production rates such as up to five 180 page documents per second.

To achieve such high production rates, large quantities of consumables need to be readily available for the printers. Thus, once again, such a commercial printer needs to occupy an extremely large volume although the cost of such a printer is considerably lower than equivalent high end, commercial printers which do not use the applicant's Memjet (Memjet is a trade mark of Silverbrook Research Pty Ltd) technology.

The applicant has recognised a need for a commercial printer which occupies a smaller volume and which has a lower through put rate but of the same quality as the applicant's previously proposed Memjet commercial printer.

SUMMARY OF THE INVENTION

According to the invention, there is provided drying equipment for a printer for aiding drying of a printed image on a web of print media, the equipment including
a feed path through which the print media containing the printed image is fed after printing of the image on the print media;
a drive means for driving the web through the feed path at a predetermined rate; and
a supply means in communication with the feed path for supplying drying fluid over at least one surface of the web.

Preferably, printing of images takes place on opposed surfaces of the web. Accordingly, the supply means may supply drying fluid to be passed over both surfaces of the web.

The printer may be a pagewidth printer having an inlet, a pagewidth print engine arranged proximate the inlet and an exit, the feed path being defined as a distance between the print engine and the exit.

To aid in drying of the printed image or images, the feed path may have a length which is approximately 1 meter so that the surfaces of the web are in communication with the drying fluid for a sustained period of time. It will be appreciated that the period of time for which the surfaces of the web are in communication with the drying fluid is also dependent on the rate at which the web moves through the printer.

The drying means may include at least one roller set, said at least one roller set being arranged at the inlet of the printer. Preferably, the drive means includes two roller sets, a first roller set being arranged at the inlet and a second roller set being arranged at the exit of the printer.

Then, the length of the feed path may be defined as the distance between the print engine and a centre line of the second roller set.

The drive means may be operable to drive the web through the feed path at a rate of from about 0.5 m/s to about 2 m/s. More particularly, if six "color" printing is being effected, the web may move at a rate of about 1.6 m/s and, if twelve "color" printing is being effected, the web may move through the printer at a rate of approximately 0.8 m/s. The term "color" in this specification includes different colored inks visible in the visible spectrum as well as ink which is invisible in the visible spectrum but visible only in the infrared spectrum, an ink fixative and a print media surface varnish.

The fixative may be used to fix the inks on the surface of the print media and may further facilitate drying of the ink on the print media.

The supply means may include a supply duct arranged alongside the feed path, the supply duct including a connection means for connection to a source of the drying fluid.

The duct may have a length approximating that of the feed path. The duct may have outlet openings which direct drying fluid transversely to a direction of movement of the web along the feed path.

The duct may be arranged alongside an inner surface of one of the side walls of the printer. Then, an opposed side wall of the printer may include vents through which drying fluid may be exhausted from an interior of the printer.

Accordingly, by having a feed path of approximately 1 meter and feeding the web at the desired rate through the feed path, drying of images printed on the web is facilitated. By having the images dried in this manner, high speed printing is facilitated.

In another broad form the invention provides a pagewidth printhead assembly including;
a first printhead including at least two printhead 0modules;
a controller module associated with each of the printhead modules, each controller assembly including memory and a print engine controller that controls the respective printhead module;

The assembly may include a second printhead substantially identical to the first printhead.

When the assembly includes a second printhead, preferably each controller module controls a printhead module of the first printhead and a printhead module of the second printhead.

The at least two printhead modules are preferably arranged end on end.

The controller modules are preferably arranged end on end.

Preferably each controller module includes a discrete circuit board, each circuit board having a data connector for connection to the circuit board of an adjacent controller module.

Each controller module may have two data connectors, each for connection to another controller module. Preferably each data connector is located at opposed ends of each controller module.

The printhead modules of the first printhead are preferably mounted on a first housing.

The printhead modules of the second printhead are preferably mounted on a second housing.

In another broad form the invention provides a housing for an inkjet type printhead, the housing including;

at least one mounting for at least one printhead chip;

at least one fluid passageway having at least two fluid inlets and at least one outlet that, in use, communicate with at least one printhead chip.

In another broad form the invention provides a printhead assembly for an inkjet type printer, the assembly including;

a housing;

a plurality of printhead chips mounted on or in the housing;

the housing including at least one passageway in fluid communication with at least one printhead chip;

each respective at least one passageway having at least two fluid inlets.

The housing is preferably elongate with a plurality of mountings extending end-on-end along the length of the housing. More preferably the housing is symmetric in at least one view.

Preferably each fluid passageway has two fluid inlets.

In preferred forms the housing is elongate and each fluid passageway has two fluid inlets, each at opposite ends of the housing.

The assembly may include at least one closure sealing closing at least one of said at least two fluid inlets.

In another broad form the invention provides a printer including a printhead assembly having a fluid passageway in communication with a printhead chip, the fluid passageway having two inlets, a first inlet connected to a source of fluid to be printhead by the printhead chip and a second inlet closed by a closure.

In another broad form the invention provides a method of aiding drying of printed material in a continuous media inkjet type printer, the method including substantially simultaneously printing at least one ink and at least one drying agent onto the media, the at least one drying agent reducing the drying time of at least one of the at least one ink on the media compared to when printed without the drying agent.

The at least one drying agent is preferably a fixative for at least one of the at least one ink.

The at least one ink may include a varnish.

The method may include providing a first printhead, that prints at least one of the at least one ink, and a second printhead, that prints at least one of the at least one drying agent, adjacent to the first printhead, one of the first and second printheads being located downstream of the other printhead.

The second printhead is preferably located downstream of the first printhead.

The method may include printing on both surfaces of the continuous print media.

The at least one drying agent preferably facilitates drying in warm air.

In another broad from the invention provides an inkjet type printer including:

a printer mechanism that prints at least one material on at least one surface of print media;

a media conveyor that engages the media to convey the media past the printer mechanism, said media conveyor including at least one component that engages the media downstream of the printer mechanism, the at least one component located at a distance from the printer mechanism, and the conveyor operated to convey said media past the printer mechanism, such that material printed by the printer mechanism onto the media is dry or substantially dry when it reaches the at least one component.

Preferably the conveyor operates to convey the media past the printer mechanism at between about 0.5 m/s and about 2 m/s.

In some embodiments the printer of claim 2 wherein the conveyor may operates to convey the media past the printer mechanism at about 1.6 m/s.

In other embodiments the conveyor operates to convey the media past the printer mechanism at about 0.8 m/s.

In some embodiments the conveyor is operated to convey the media past the printer mechanism at a speed such that the media takes between about 0.5 seconds and about 2 seconds to travel from the printer mechanism to the at least one component.

In some embodiments wherein the conveyor is operated to convey the media past the printer mechanism at a speed such that the media takes between about 0.5 seconds and about 1.25 seconds to travel from the printer mechanism to the at least one component.

In other embodiments the conveyor is operated to convey the media past the printer mechanism at a speed such that the media takes between about 0.5 seconds and about 0.625 seconds to travel from the printer mechanism to the at least one component.

In other embodiments the conveyor is operated to convey the media past the printer mechanism at a speed such that the media takes between about 0.5 seconds and about 1 second to travel from the printer mechanism to the feed mechanism.

In some embodiments the media travels along a path about 1 m in length between the printer mechanism and the at least one component.

In preferred embodiments the print media is continuous.

In another broad form the invention provides a printhead assembly including:

a housing;

at least one multi-fluid inkjet printhead chip;

the housing defining a plurality of fluid galleries, each of which is isolated from the other galleries;

each gallery being in fluid communication with said at least one printhead chip.

The preferably, in cross-section, the galleries follow a non-linear path and more preferably a J-shaped path galleries may be located one on top of each other above the at least one printhead chip.

The in cross-section, the galleries are preferably arranged on a non-linear path.

The in cross-section, the galleries are preferably arranged along a J-shaped path.

The housing preferably includes an arcuate shaped section.

Each gallery preferably has at least two fluid inlets, whereby fluid may be supplied to each gallery from one or more of said fluid inlets.

The printhead assembly may be an elongate pagewidth printhead assembly and said at least two fluid inlets comprise inlets at either longitudinal end of the housing.

The printhead assembly may also include at least one closure closing at least one inlet of each gallery.

In another broad form the invention provides a printer including a printhead assembly the assembly including:

a housing;

at least one multi fluid inkjet printhead chip mounted on or in the housing;

the housing defining a plurality of fluid galleries, each of which is isolated from the other galleries;

each gallery being in fluid communication with said at least one printhead chip.

The arcuate shaped section preferably has a centre of curvature coincident with the axis.

The printer may include at least one print media feed roller mounted for rotation about an axis, said printhead assembly being located adjacent the roller with the arcuate shaped section adjacent the roller.

The printer may also include at least one closure closing at least one inlet of each gallery.

In another broad form the invention provides a pagewidth printhead assembly including:

a longitudinal housing;

at least one elongate printhead chip mounted in or on the housing and extending along the length of the housing;

at least one gas supply duct in the housing that supplies gas to the at least one printhead chip, said duct extending along the longitudinal direction of the housing.

Preferably the at least one printhead chip includes a plurality of printhead chips extending end on end along the length the housing.

The housing preferably has first and second ends and the at least one gas supply duct is open at one of the first and second ends.

The housing preferably has first and second ends and the at least one gas supply duct is open at both the first and second ends. The assembly may include at least one closure that engages the at least one gas supply duct at one of the first and second ends. The assembly may include a gas supply connector that connects to the at least one duct at the other of the first and second ends.

There may be only a single gas supply duct.

The at least one gas supply duct may be located to one side of the at least one printhead chip.

In another broad form the invention provides an inkjet printer having:

a first set of opposed rollers that engage opposite sides of print media located there between;

a second set of opposed rollers that engage opposite sides of print media located there between, an inkjet type printing mechanism that prints ink on at least one surface of the media from at least one nozzle, said printing mechanism being located between the two pairs of rollers, said at least one nozzle being approximately 0.75 mm from the respective media surface.

Preferably the media travels from the first set to the second of rollers.

At least one of the first set of rollers may have a effective outside radius of $R_1$, and preferably said printing mechanism prints material onto the at least one surface within $2R_1$, of the line of engagement of the rollers with the media and more preferably within $R_1$ of the line of engagement.

The printing mechanism prints material onto the media within $R_1$ of the line of engagement.

The media is preferably maintained in tension between the two sets of rollers.

The printing mechanism preferably includes a first print engine that prints on one surface of the print media and a second print engine that prints on the other surface of the print media.

The printing mechanism preferably includes a printhead that extends transversely across the media, said printhead mounted on a movable support, whereby the printhead is movable toward or away from the surface the media.

The media is preferably continuous.

Preferably both rollers of the first set of the first set have an effective outside radius of $R_1$.

Preferably the printing mechanism prints material onto both surfaces of the media.

In another broad form the invention provides an inkjet type printer including:

a print media feed mechanism including a first roller that engages print media and is rotatable about an axis to move the print media along a path;

a first printing mechanism that prints one or more materials onto a first surface of the print media;

the first printing mechanism located adjacent the first roller to print at least some of the one or more materials onto the print media less than $2R_1$ from a first line of contact of the first roller with the print media, where $R_1$ is the effective outside radius of the first roller.

Preferably the first printing mechanism is located to print at least some materials onto the print media less than $R_1$ from the first of contact.

The first roller may be located upstream of the printing mechanism.

The printing mechanism and the first roller are preferably located on the same side of the print media.

The first printing mechanism may include a first printhead, the first printhead located to print material within $R_1$ of the first line of contact.

The first printing mechanism may include a second printhead the second printhead, located to print material within $2R_1$, of the first line of contact.

The printer may include a second roller opposed to the first roller and located on an opposite side of the print media to the first roller, said second roller engaging the print media.

The printer may include a second printing mechanism that prints one or more materials onto a second surface of the print media;

the second printing mechanism printing at least some of the one or more materials onto the print media less than about $2R_2$ from a second line of contact of the second roller with the print media, where $R_2$ is the effective outside radius of the second roller.

Preferably the second printing mechanism is located to print at least some material onto the print media less than $R_2$ from the second line of contact.

The second printing mechanism may include a third printhead that is located to print material within $R_2$ of the second line of contact.

The second printing mechanism may include a fourth printhead that is located to print material within $2R_2$ of the second line of contact.

The first printing mechanism is preferably located to print at least some material onto the print media within about 1 cm of the line of contact.

The second printing mechanism is preferably located to print at least some material within about 1 cm of the second line of contact.

The print media to first printing mechanism separation is preferably about 0.75 mm.

The print media to second printing mechanism separation is preferably about 0.75 mm.

In another broad from the invention provides a printer including:

a printing mechanism that prints one or more materials onto at least one surface of print media;

a conveyor that conveys the print media from the print mechanism along a path;

at least one fluid outlet adjacent the path that outputs drying fluid over at least the at least one surface of the print media that has been printed on by the printing mechanism.

The drying fluid preferably moves transversely across the print media relative to the general direction of travel of the print media.

The at least one fluid outlet may be located to one side of the path.

The drying fluid may pass over both surfaces of the print media.

The print media is preferably conveyed along the path at a substantially constant speed.

The print media may be continuous.

The drying fluid is preferably air and more preferably warmed air.

The printer preferably includes an enclosure substantially enclosing the path, said at least one fluid outlet being located within the enclosure.

There is preferably at least one vent in the enclosure through which drying fluid may escape the enclosure.

The printing mechanism may include at least one stationary inkjet printhead assembly extending across substantially the width of the print media.

The printing mechanism may include at least one stationary inkjet printhead assembly extending across substantially the width of each opposed surface of the print media.

In another broad form the invention provides an inkjet type printer including:

a conveyor that conveys media along a path past at least one printhead assembly that extends substantially across the width of the media relative to the direction of travel along the path;

a control system that controls the printhead assembly;

a buffer in which print data is stored, said control system reading print data from said buffer and causing said at least one printhead assembly to print information derived from the read print data onto the media.

Preferably the buffer stores print data corresponding to at least one page of information.

The print data is preferably received by the printer via at least one input is stored in the buffer whilst simultaneously the control system reads print data stored in the buffer.

The conveyor preferably conveys the media past the at least one printhead assembly at a substantially constant speed.

Preferably the media is continuous and preferably the buffer is sized to allow continuous printing.

Each printhead assembly may include at least two printhead modules arranged end on the end across the width of the media.

The buffer may include at least two physically and logically distinct memory modules.

The control system may include at least two physically and logically distinct control modules.

The printer may have a printable width comprised of at least two sections and each respective printhead assembly includes at least two printhead modules each of which prints a different section;

said the buffer includes at least one logically distinct memory module associated with each printhead module, and said control system includes at least one physically and logically distinct control module associated with each printhead module, and wherein the each control module retrieves data from an associated memory module and causes the associated printhead module to print information corresponding to data so retrieved.

Each printhead module may include two elongate printhead chips assemblies, each of said printhead chip assemblies extending in parallel across the respective section.

Preferably each control module includes two printer engine control chips.

The printer preferably includes at least one data input and a serial data connection interconnecting said buffer with said at least one input. More preferably there are two data inputs.

The printer may have a printable width of about 18.625 inches, with each printhead assembly capable of printing 12 different materials and a buffer of about 32 MB per printable surface. This equates to a buffer size of about 5772 bytes per colour per cm of printable width.

Greater buffer sizes, up to about 2 GB per printable surface may be provided.

In another broad form the invention provides an inkjet type printer including:

a conveyor that conveys media along a path past at least one printhead assembly that extends substantially across the width of the media relative to the direction of travel along the path;

a control system that controls the printhead assembly;

a buffer in which print data is stored, said control system reading print data from said buffer and causing said at least one printhead assembly to print information derived from the read print data onto the media.

Preferably the buffer stores print data corresponding to at least one page of information.

The print data is preferably received by the printer via at least one input is stored in the buffer whilst simultaneously the control system reads print data stored in the buffer.

The conveyor preferably conveys the media past the at least one printhead assembly at a substantially constant speed.

Preferably the media is continuous and preferably the buffer is sized to allow continuous printing.

Each printhead assembly may include at least two printhead modules arranged end on the end across the width of the media.

The buffer may include at least two physically and logically distinct memory modules.

The control system may include at least two physically and logically distinct control modules.

The printer may have a printable width comprised of at least two sections and each respective printhead assembly includes at least two printhead modules each of which prints a different section;

said the buffer includes at least one logically distinct memory module associated with each printhead module, and said control system includes at least one physically and logically distinct control module associated with each printhead module, and wherein the each control module retrieves data from an associated memory module and causes the associated printhead module to print information corresponding to data so retrieved.

Each printhead module may include two elongate printhead chips assemblies, each of said printhead chip assemblies extending in parallel across the respective section.

Preferably each control module includes two printer engine control chips.

The printer preferably includes at least one data input and a serial data connection interconnecting said buffer with said at least one input. More preferably there are two data inputs.

The printer may have a printable width of about 18.625 inches, with each printhead assembly capable of printing 12 different materials and a buffer of about 32 MB per printable surface. This equates to a buffer size of about 5772 bytes per colour per cm of printable width.

Greater buffer sizes, up to about 2 GB per printable surface may be provided.

In another broad form the invention provides an inkjet type printer including:

a conveyor that conveys media along a path, past at least one printhead assembly that extends substantially across the width of the media relative to the direction of travel along the path;

a control system that controls the printhead assembly;

at least one input that receives document data;

a buffer in which document data received via the at least one input is stored, said control system reading document data from said buffer and causing said at least one printhead assembly to print at least one document derived from the document data onto the media, wherein the printer prints at least one document corresponding to first document data stored in the buffer whilst simultaneously receiving, via the at least one input, and storing, in the buffer, second document data.

The buffer preferably stores more than two sets of document data for each surface that is printed on.

Preferably the printer includes at least one printhead assembly that prints on one surface of the media and at least one printhead assembly that prints on a second surface of the media.

The conveyor preferably conveys the media past the at least one printhead assembly at a substantially constant speed.

Preferably the media is continuous and preferably the buffer is sized to allow continuous printing.

Each printhead assembly may include at least two printhead modules arranged end on the end across the width of the media.

The buffer may include at least two physically and logically distinct memory modules.

The control system may include at least two physically and logically distinct control modules.

The printer may have a printable width comprised of at least two sections and each respective printhead assembly includes at least two printhead modules each of which prints a different section;

said the buffer includes at least one logically distinct memory module associated with each printhead module, and said control system includes at least one physically and logically distinct control module associated with each printhead module, and wherein the each control module retrieves data from an associated memory module and causes the associated printhead module to print information corresponding to data so retrieved.

Each printhead module may include two elongate printhead chips assemblies, each of said printhead chip assemblies extending in parallel across the respective section.

Preferably each control module includes two printer engine control chips.

The printer preferably includes a serial data connection interconnecting said buffer with said at least one input. More preferably there are two data inputs.

The printer may have a printable width of about 18.625 inches, with each printhead assembly capable of printing 12 different materials and a buffer of about 32 MB per printable surface. This equates to a buffer size of about 5772 bytes per color per cm of printable width.

Greater buffer sizes, up to about 2 GB per printable surface may be provided.

BRIEF DESCRIPTION OF THE DRAWINGS

The invention is now described by way of example with reference to the accompanying drawings in which:

FIG. 2 shows a plan view of the printer;

FIG. 3 shows a side view of the printer;

FIG. 4 shows an end view of the printer;

DETAILED DESCRIPTION OF THE DRAWINGS

Figure 1:
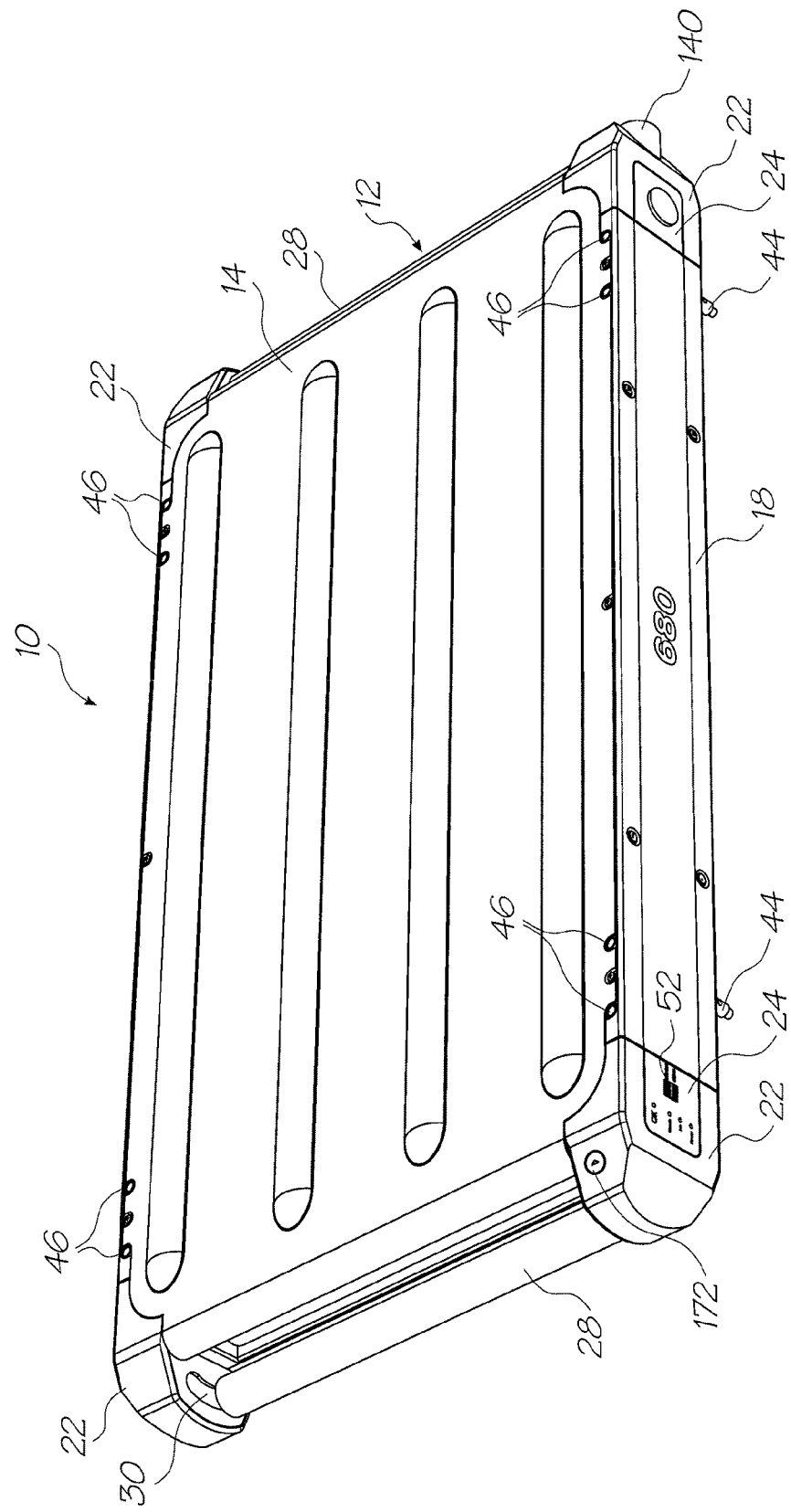
FIG. 1 shows a three dimensional view of a printer, in accordance with the invention.

Referring to the drawings, reference numeral 10 generally designates a printer, in accordance with the invention. The printer 10 is a modular printer to be used in combination with other, identical printers, as will be described in greater detail below for effecting high speed, digital, photographic quality, commercial printing. Arrays of the printers 10 can be combined to provide scalable printing systems. However, single printers 10 may also be used individually, if desired.

Figure 9:
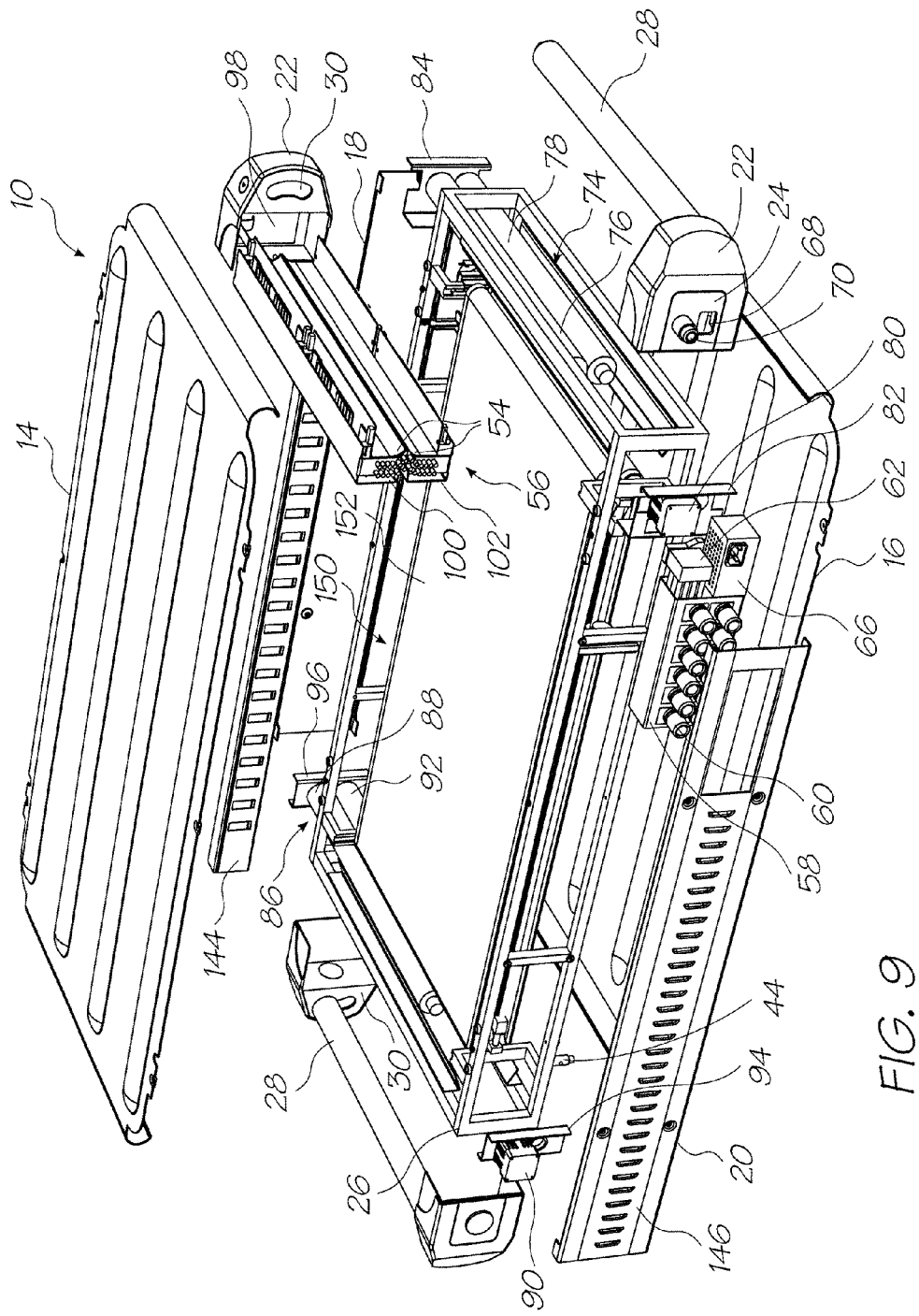
FIG. 9 shows a three dimensional, exploded view of the printer.

The printer 10 comprises a housing 12. The housing 12 is made up of an upper cover 14, a lower cover 16 (FIG. 9), a first side wall 18 and a second, opposed side wall 20 (FIG. 9). Each side wall 18, 20 terminates in an end cap or cheek molding 22. Each cheek molding 22 is the same to reduce the costs of production of the printer 10. Each cheek molding 22 has a slot in which an application-specific insert 24 is received.

The housing 12 surrounds a frame 26. Internal components of the printer 10 are supported on the frame 26.

Opposed cheek moldings 22 at each end of the housing 12 support a guide roller 28 adjustably between them. Thus, each cheek molding 22 defines an arcuate slot 30 within which an axle of its associated roller 28 is received.

Figure 5:
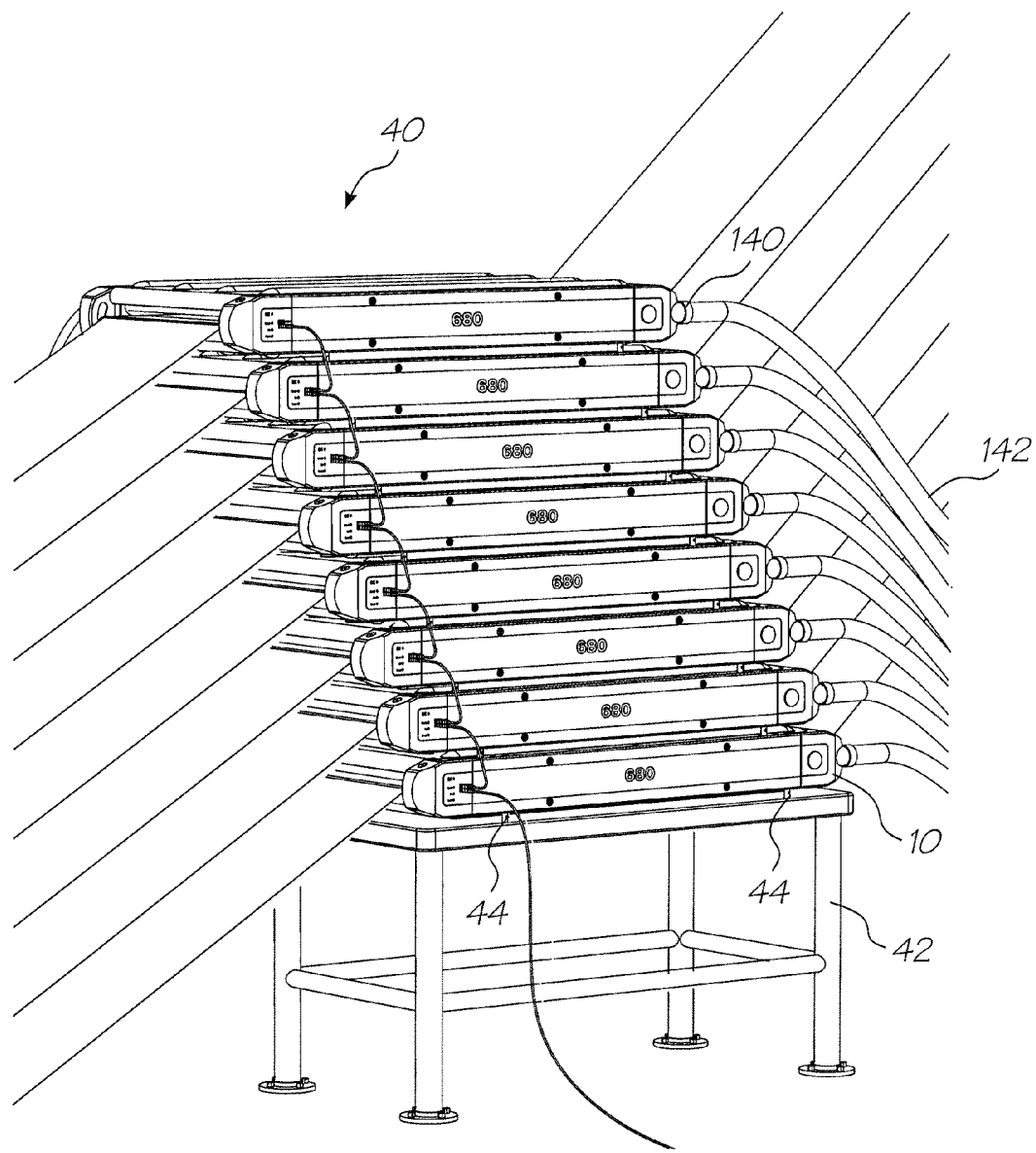
FIG. 5 shows a three dimensional view of a printer stack, in accordance with one embodiment of the invention.
Figure 6:
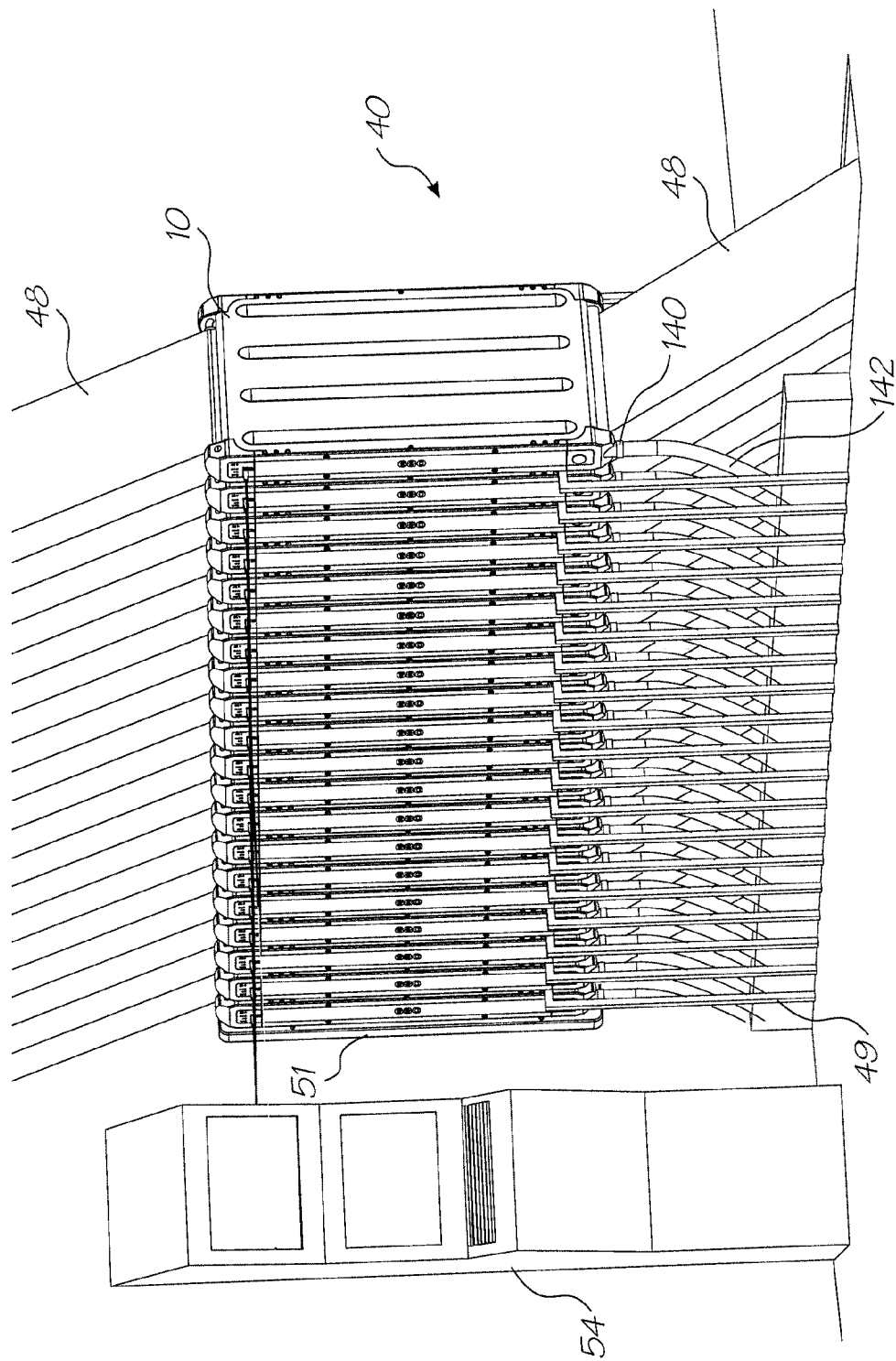
FIG. 6 shows a three dimensional view of a printer stack, in accordance with another embodiment of the invention.

As described above, it is intended that, for commercial printing applications, a plurality of the printers 10 will be used together. As illustrated in FIGS. 5 and 6 of the drawings, the printers 10 are stacked together to form a stack 40. In the embodiment illustrated at FIG. 5, the stack 40 is arranged on a support table 42. A lowermost printer 10 in the stack 40 is locked to the table 42 by means of locking feet 44 of the printer 10. The locking feet 44 of each subsequent printer 10 in the stack 40 are received in associated holes 46 in a top of a subjacent printer 10. Each locking foot 44 has a bayonet fitting so that, when the foot 44 is inserted into one of the holes 46 of the subjacent printer or the table 42, as the case may be, a quarter turn of the foot 44 locks the upper printer 10 with respect to the subjacent printer 10 or the table 42.

As illustrated in FIG. 5 of the drawings, the printers 10, when stacked horizontally, may be offset with respect to each other by locking the locking feet 44 of one printer 10 into the appropriate holes 46 of the subjacent printer. Hence, a plurality of serially aligned holes 46 is arranged adjacent each cheek molding 22. By appropriate selection of the holes 46, the requisite degree of offset, if any, can be achieved.

The offset stacking of the printers 10 allows print media, such as paper 48, to be fed from unwinders (not shown) into each of the printers 10 at a predetermined angle and to be fed out of the printers 10 at a suitable exit angle. If the paper 48 is to be fed in and out of the printers 10 horizontally, the printers 10 of the stack 40 are vertically aligned with respect to each other.

In FIG. 6, another embodiment of the stack 40 is shown. In this embodiment, the printers 10 are arranged vertically and are spaced horizontally with respect to each other. In the example illustrated, paper 48 is fed into each printer 10 at an upper end of the printer and is fed out, after printing, through a bottom of each printer 10. The stack 40 is supported on a framework 49 with the printer at one end of the stack 40 being locked to an end plate 51 of the framework 49 via its locking feet 44. Adjacent printers 10 in the stack 40 are locked together by inserting the locking feet 44 of one printer 10 into the appropriate holes 46 of the adjacent printer 10. A control console 54 is provided for controlling operation of the printer stack 40.

Each printer 10 communicates with its controller and with other printers in the stack 40 via a USB2 connection 50 received in a double USB port arrangement 52. The port arrangement 52 has an inlet port and an outlet port for enabling the printers 10 of the stack 40 to be daisy-chained together and to communicate with each other.

Figure 7:
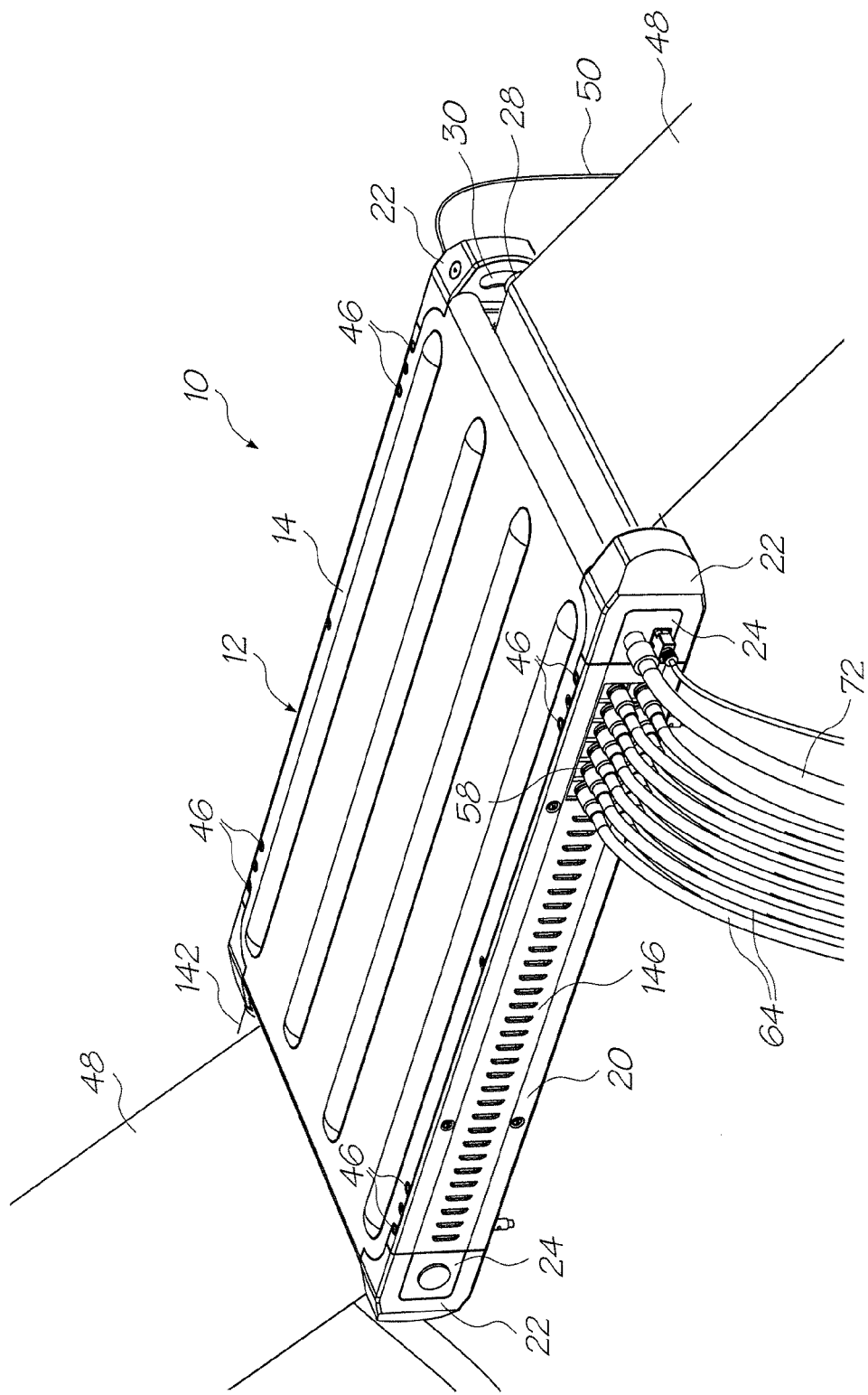
FIG. 7 shows a three dimensional view of the printer including its fluid connections.

Each printer includes a print engine 56 made up of a pair of opposed print head assemblies 54 for enabling double-sided printing to be effected. The print head assembly 54 (FIG. 11) of the print engine 56 of the printer 10 can print in up to twelve colors. As will be described in greater detail below, each print head assembly 54 is a duplexed print head so that, if desired, six colors, duplicated, can be printed by each print head assembly 54. Ink is fed to the print engine 56 via an ink coupling box 58. The coupling box 58 supports twelve ink couplings 60 thereon. Ink hoses 64 are coupled to the coupling box 58 via the couplings 60 and communicate with the print head assemblies 54 of the print engine 56 via an ink connector 62 (FIG. 9). A power connection port 66 is also supported on the ink coupling. The port 66 is received through an opening 68 in one of the inserts 24 of one of the cheek moldings 22. The same insert 24 supports an air coupling 70. An air hose 72 (FIG. 7) feeds air to the print head assemblies 54 of the print engine 56 to maintain print head nozzles (not shown) of the print head assemblies 54 free of debris and foreign matter.

A roller assembly 74 is mounted at an inlet end of the printer 10. The roller assembly 74 includes a drive roller 76 and a driven roller 78. The drive roller 76 is driven by a drive motor 80 supported on a metal bracket 82. The metal bracket 82 is mirrored by a corresponding bracket 84 at an opposed end of the roller assembly 74. The brackets 82 and 84 are supported on the frame 26.

In addition, a similar, exit roller assembly 86 is provided at an outlet end of the printer 10. Once again, the roller assembly 86 has a drive roller 88 driven by a drive motor 90 and a driven roller 92. The rollers 86 and 92 are supported between metal brackets 94 and 96. The brackets 94 and 96 are secured to the frame 26. The bracket 94 also supports the motor 90.

The drive roller 76 drives the driven roller 78 via a set of helical gears 132. A similar arrangement applies in respect of the roller 88 and 92 of the roller assembly 86.

The cheek molding 22, at the inlet end of the printer 10, opposite the molding 22 supporting the air coupling 70, also supports a USB control PCB 98.

The print engine 56 is supported by a chassis comprising a pair of opposed metal brackets 100, 102 mounted downstream (in a direction of feed of the paper) of the roller assembly 74. Each metal bracket 100, 102 supports one of the print head assemblies 54 of the print engine 56.

Figure 10:
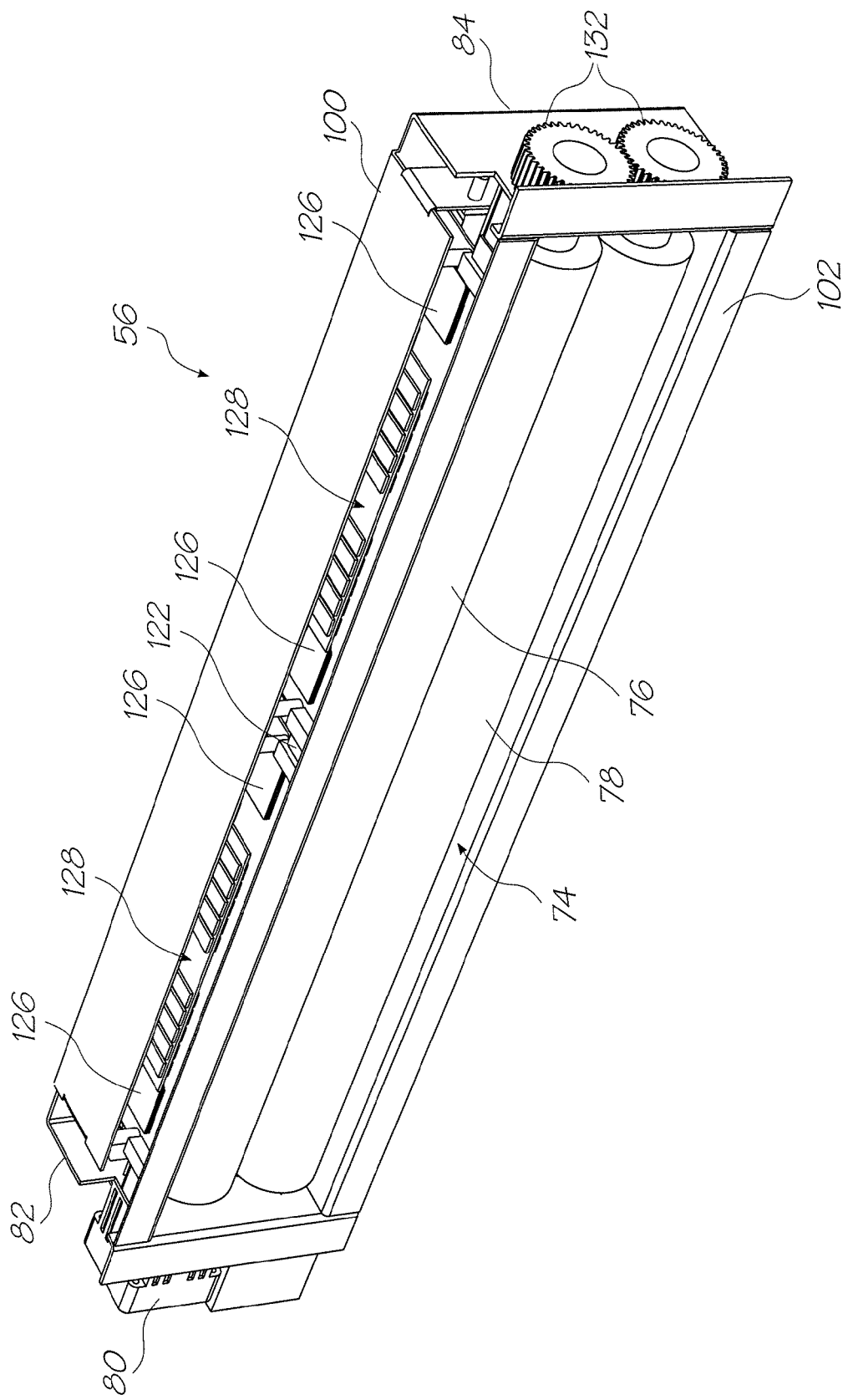
FIG. 10 shows a three dimensional view of a print engine of the printer.
Figure 11:
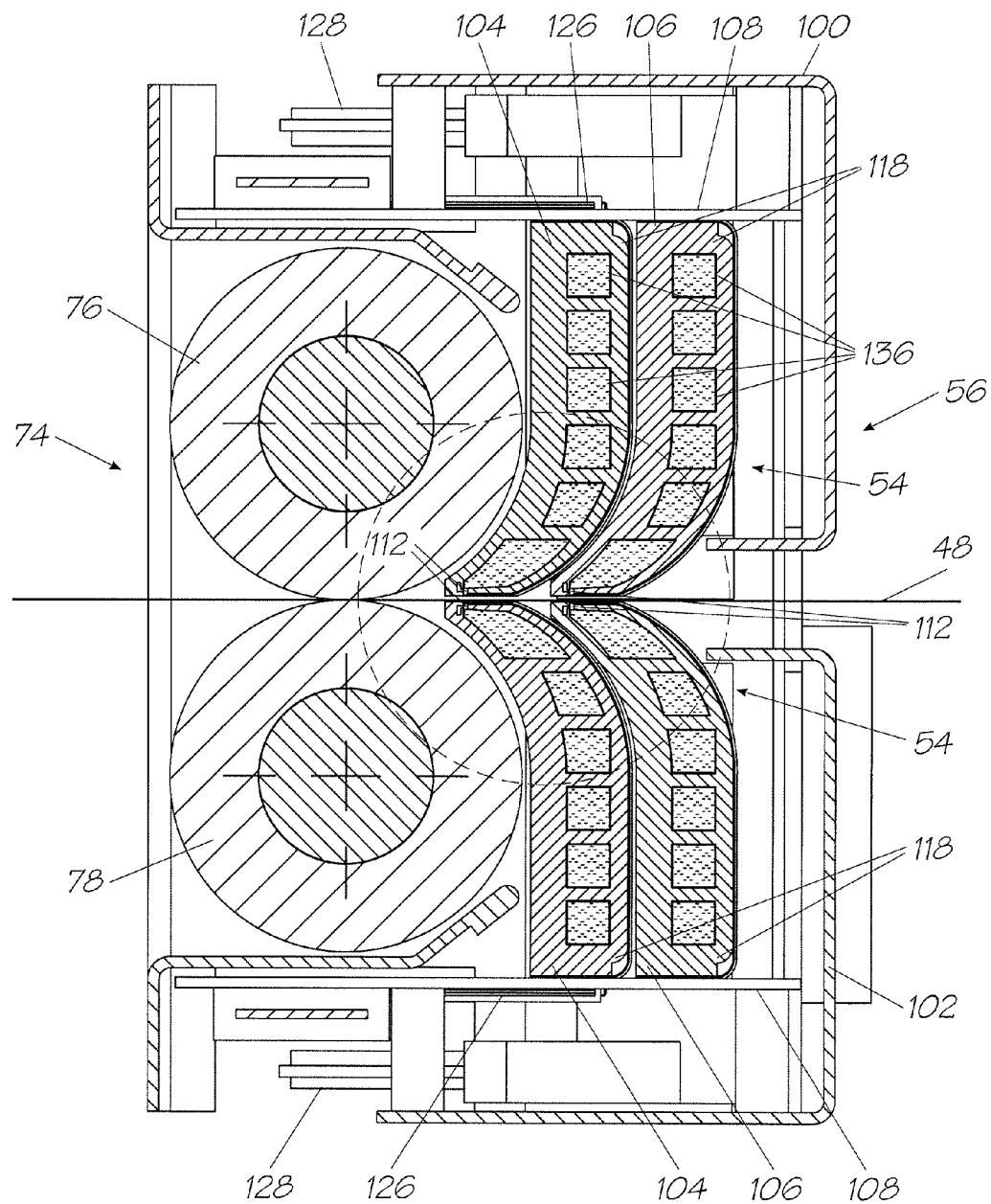
FIG. 11 shows a sectional end view of the print engine.
Figure 12:
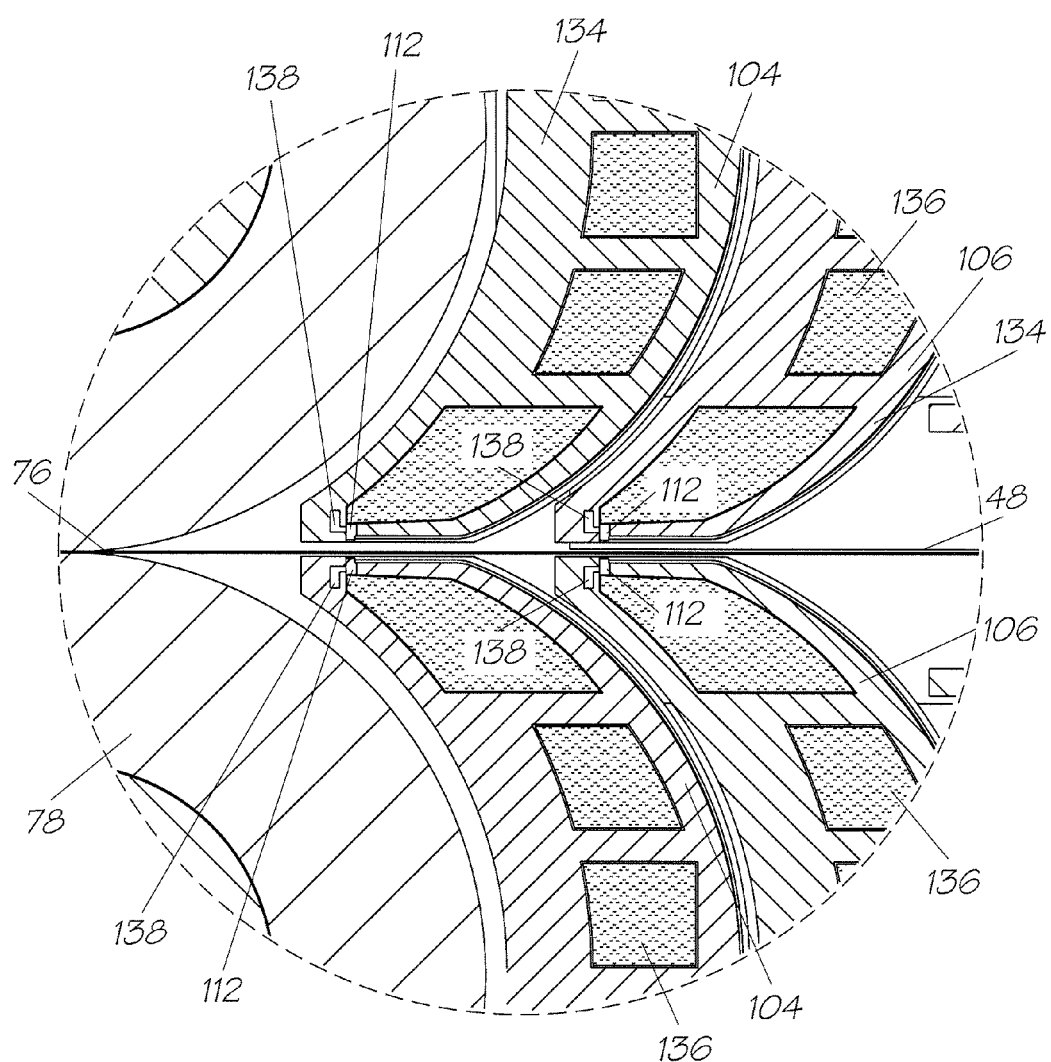
FIG. 12 shows, on an enlarged scale, part of the print engine.

The print engine 56 is shown in greater detail in FIGS. 10 to 12 of the drawings. As described above, the print engine 56 comprises two print head assemblies 54. The print head assemblies 54 are arranged in opposed relationship to enable double sided printing to be effected. In other words, the paper 48 passes between the print head assemblies 54. The brackets 100, 102 support the print head assemblies 54 and position the print head assemblies 54 approximately 0.75 mm apart from the web of paper 48. This distance is automatically adjusted by the brackets 100, 102 to maintain constant spacing with varying paper thickness.

In addition, as will be described in greater detail below, print heads of the print head assemblies 54 are so designed as to allow for close proximity to the rollers 76 and 78 resulting in a closely controlled paper to print head gap.

Each print head assembly 54 comprises a first print head 104 and a second, adjacent print head 106. Each print head 104, 106, further, is made up of two modules 104.1 and 104.2 and 106.1 and 106.2, respectively.

The modules 104.1 and 106.1 are coupled together and are controlled by a first printed circuit board (PCB) 108. Similarly, the modules 104.2 and 106.2 are coupled together and are controlled by a second printed circuit board (PCB) 110. PCB's 108 and 110 communicate with print head chips 112 of the print heads 104 and 106 via flex PCB's 114. These flex PCB's 114 terminate in terminal pads 116 on moldings 118 of the modules 104.1, 104.2, 106.1 and 106.2 of the print heads 104 and 106. The terminal pads 116 communicate with corresponding pads (not shown) of the PCB's 108, 110.

It is to be noted that the moldings 118 are mirror images of each other, each having ink inlets 120 at a free end thereof. Ink is fed in at one end of interconnected moldings 118 only so that the inlets 120 not being used are plugged by appropriate plugs. Also, the PCB's 108, 110 are mirror images of each other. This reduces the cost of production of the printer 10 and also enables rapid and easy assembly of the printer 10. The PCB's 108 and 110 communicate with each other via a serial cable 122. One of the PCB's 108, 110 is connected via a connector 124 to the USB circuit board 98.

Each PCB 108, 110 includes two print engine controllers (PEC's) 126 and associated memory devices 128. The memory devices 128 are dynamic random access memory (DRAM) devices.

Figure 13:
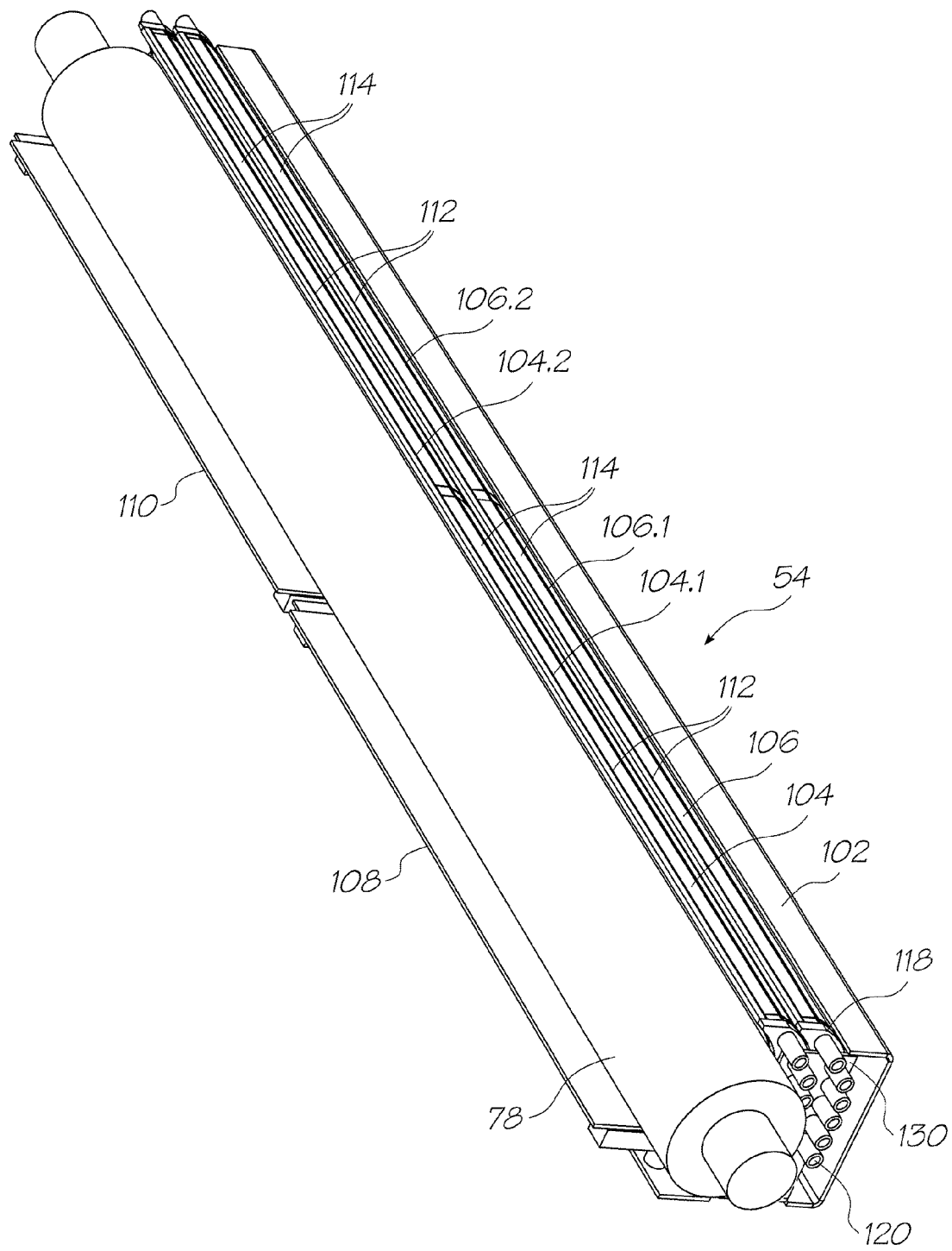
FIG. 13 shows a three dimensional view of one of the print head assemblies of the print engine.
Figure 14:
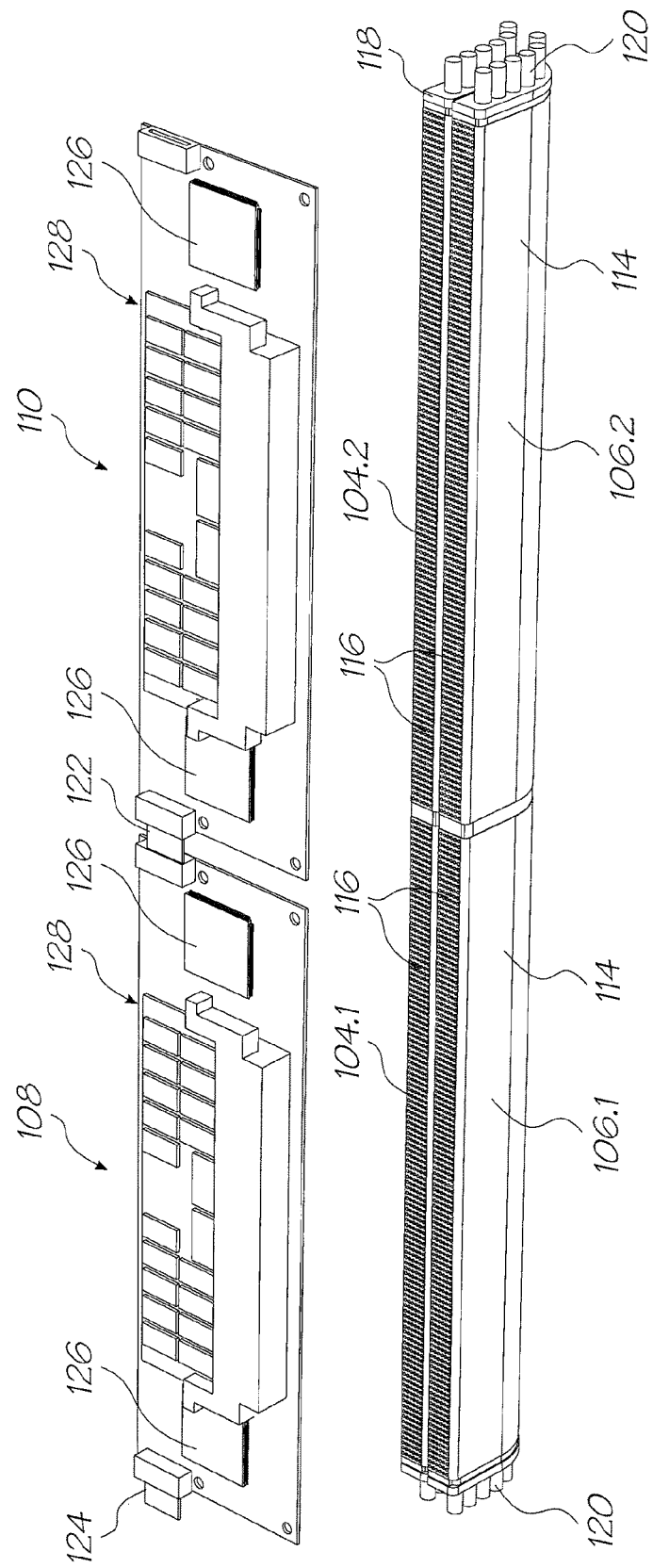
FIG. 14 shows a three dimensional, exploded view of one of the print head assemblies.
Figure 15:
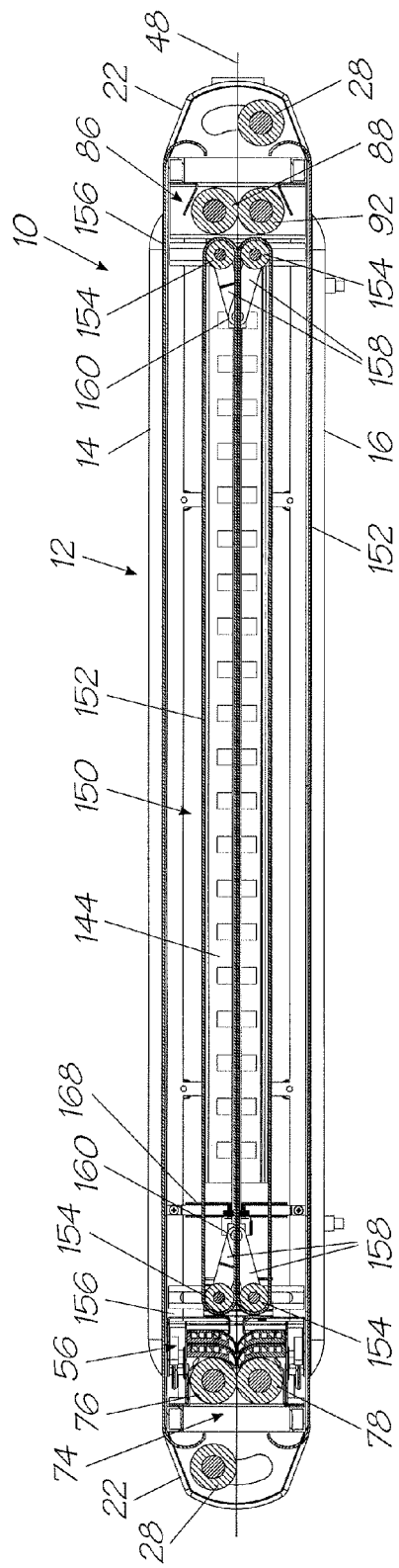
FIG. 15 shows a sectional side view of a print media loading mechanism of the printer, in its loading configuration.
Figure 16:
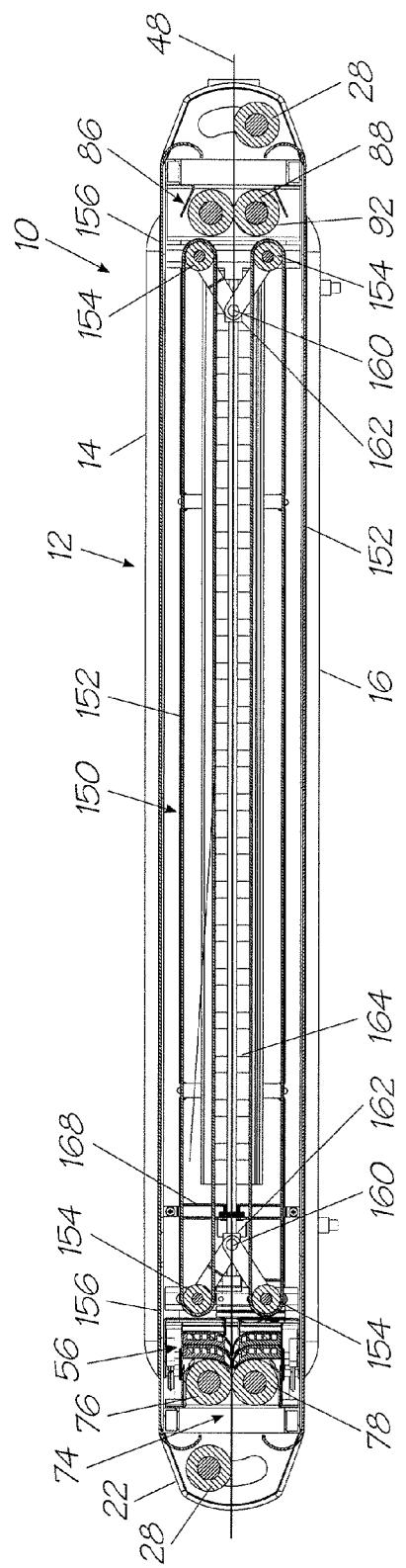
FIG. 16 shows a sectional side view of the loading mechanism of the printer in its open, non-loading configuration.
Figure 17:
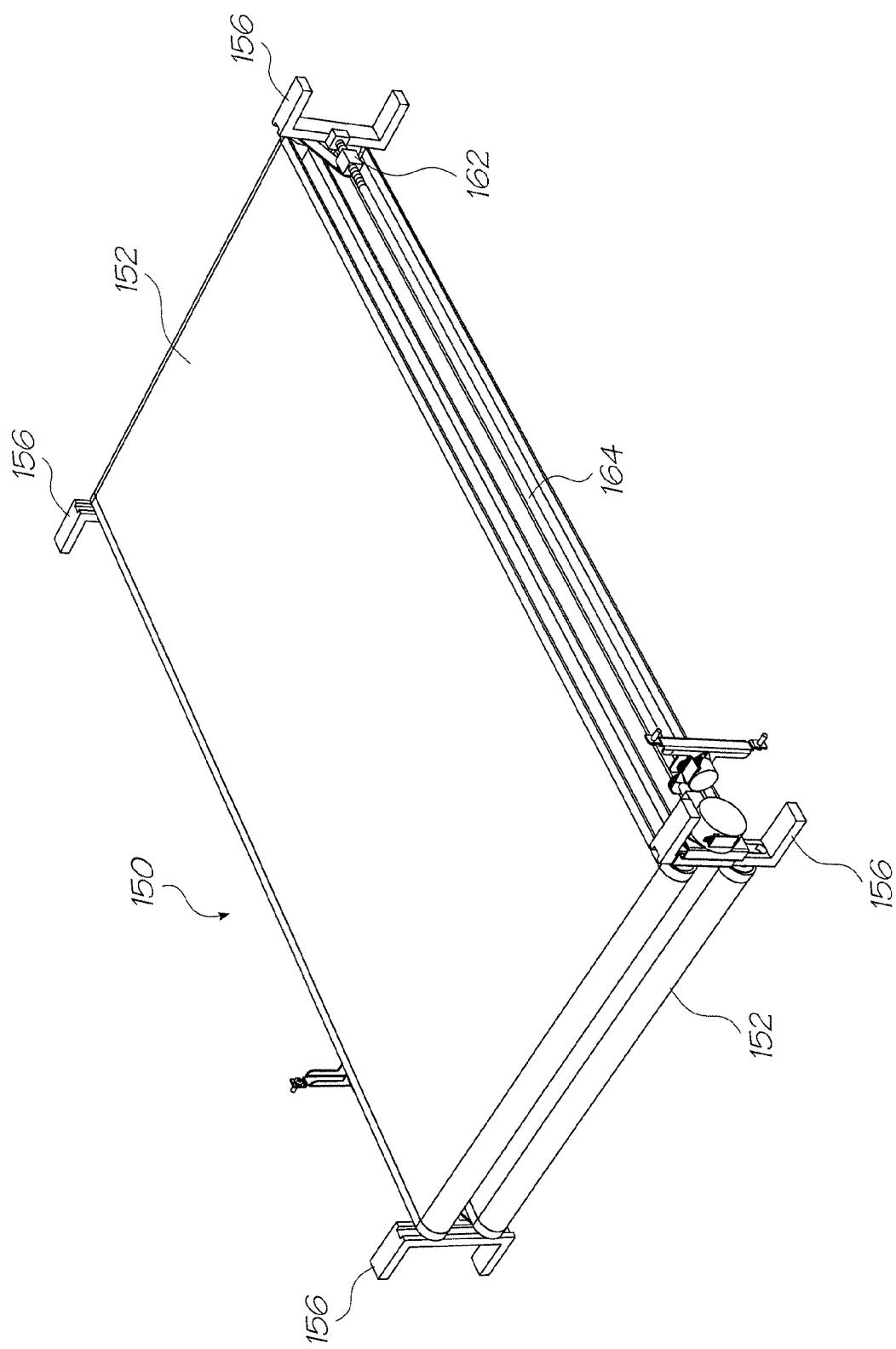
FIG. 17 shows a three dimensional view of the loading mechanism in its non-loading configuration.

The molding 118 of each print head assembly 54 is supported on the frame 100, 102 via an end plate 130 (FIG. 13).

The print engine 56 is shown in greater detail in FIG. 11 of the drawings. The print engine 56 comprises the two print head assemblies 54. As previously described, each print head assembly 54 comprises two print heads 104, 106. Each print head 104, 106 has a print head chip 112 associated therewith. The print head chips 112 of the print heads 104, 106 are supported along a longitudinal edge portion of the moldings 118. The edge portion of each molding 118 which carries the print head chip 112 is arcuate. The arcuate portion of each molding 118 has a radius of curvature which approximates that of the radius of the rollers 76, 78. This design of the print heads 104, 106 allows for close proximity of the print head chips 112 to the rollers 76, 78 resulting in a closely controlled paper to print head gap. In so doing the printhead chip 112 prints in a portion of the paper, which is taut, resulting in a more accurate deposition of ink drops on the paper 48.

As illustrated more clearly in FIG. 12 of the drawings, an air channel 138 is arranged adjacent each print head chip 112 for feeding air to the print head chip 112 from the air hose 72.

With this arrangement of print head assemblies 54, either six colors or twelve colors can be printed. Where six colors are to be printed, these are duplicated in the print heads 104, 106 of each assembly 54 by having the appropriate colored ink or related matter (referred to for convenience as "colors") in the relevant galleries 136 of the moldings 118. Instead, each print head assembly 54 can print the twelve "colors" having the appropriate "colors" charged into the galleries 136 of the print heads 104, 106. Where six "colors" are to be printed, these are normally cyan, magenta, yellow and black. The remaining galleries 136 then have an ink fixative and a varnish. Where twelve "colors" are to be printed, the "colors" are cyan, magenta, yellow, black, red, green, blue, either three spot colors or two spot colors and infrared ink, and the fixative and the varnish.

The printer 10 is designed so that, where six "colors" are to be printed, the printer can print at a printing speed of up to 1,360 pages per minute at a paper speed of 1.6 m/s. Where twelve "colors" are to be printed, the printer 10 is designed to operate at a printing speed of up to 680 pages per minute at a paper speed of 0.8 m/s.

The high speed is achieved by operating the nozzles of the print head chips 112 at a speed of 50,000 drops per second.

Each print head module 104.1, 104.2, 106.1, 106.2 has six nozzle rows per print head chip 112 and each print head chip 112 comprises 92,160 nozzles to provide 737,280 nozzles per printer. It will be appreciated that, with this number of nozzles, full 1600 dpi resolution can be achieved on a web width of 18.625 inches. The provision of a web width of this dimension allows a number of pages of a document to be printed side-by-side.

In addition, matter to be printed is locally buffered and, as a result, complex documents can be printed entirely from the locally buffered data.

It is also intended that the amount of memory 128 installed on each board 108, 110 is application dependent. If the printers 10 are being used for unchanging pages, for example, for offset press replacement, then 16 megabytes per memory module is sufficient. If the amount of variability on each page is limited to text, or a small range of variable images, then 16 megabytes is also adequate. However, for applications where successive pages are entirely different, up to 1 gigabyte may need to be installed on each board 108, 110 to give a total of 4 gigabytes for the print engine 56. This allows around 2,000 completely different pages to be stored digitally in the print engine 56. The local buffering of the data also facilitates high speed printing by the printers 10.

The spacing between the print engine 56 and the exit roller assembly 86 is approximately one meter to allow for a one second warm-set ink drying time at a web speed of the paper 48 of approximately 0.8 meters per second. To facilitate drying of the printed images on the paper 48 the fixative is used in one of the ink galleries 136. In addition, warm air is blown into the interior of the printer 10 from a source (not shown) connected to an air inlet 140 (FIG. 1) via an air hose 142. The air inlet communicates with a metal air duct 144 (FIG. 9) which blows the warm air over the paper 48 exiting the print engine 56. Warm air is exhausted from the interior of the printer by means of vents 146 in the side wall 20 of the housing 12 of the printer 10.

The printer 10 includes a print media loading mechanism 150 for loading the paper 48 into the interior of the printer 10. The loading mechanism 150, comprises a pair of opposed endless belts 152 (shown more clearly in FIGS. 15 to 18 of the drawings). Although not illustrated as such, these belts 152 are foraminous to enable the warm air ducted in through the duct 144 to be blown through the belts 152 over both surfaces of the paper 48, after printing, in use.

Each belt 152 passes around a pair of spaced rollers 154. The rollers 154 are held captive to be vertically slidable in slides 156. The slides 156 are mounted on the frame 26 of the printer 10.

Each roller 154 is mounted at one end of an arm 158. The opposed end of each arm 158 is connected at a common pivot point 160 to a traverser block 162 so that the arms 158 are connected to their associated traverser block 162 scissors-fashion. The traverser block 162 is, in turn, mounted on a lead or worm screw 164. The worm screw 164 is rotatably driven by a motor 166 supported on a bracket 168.

Figure 18:
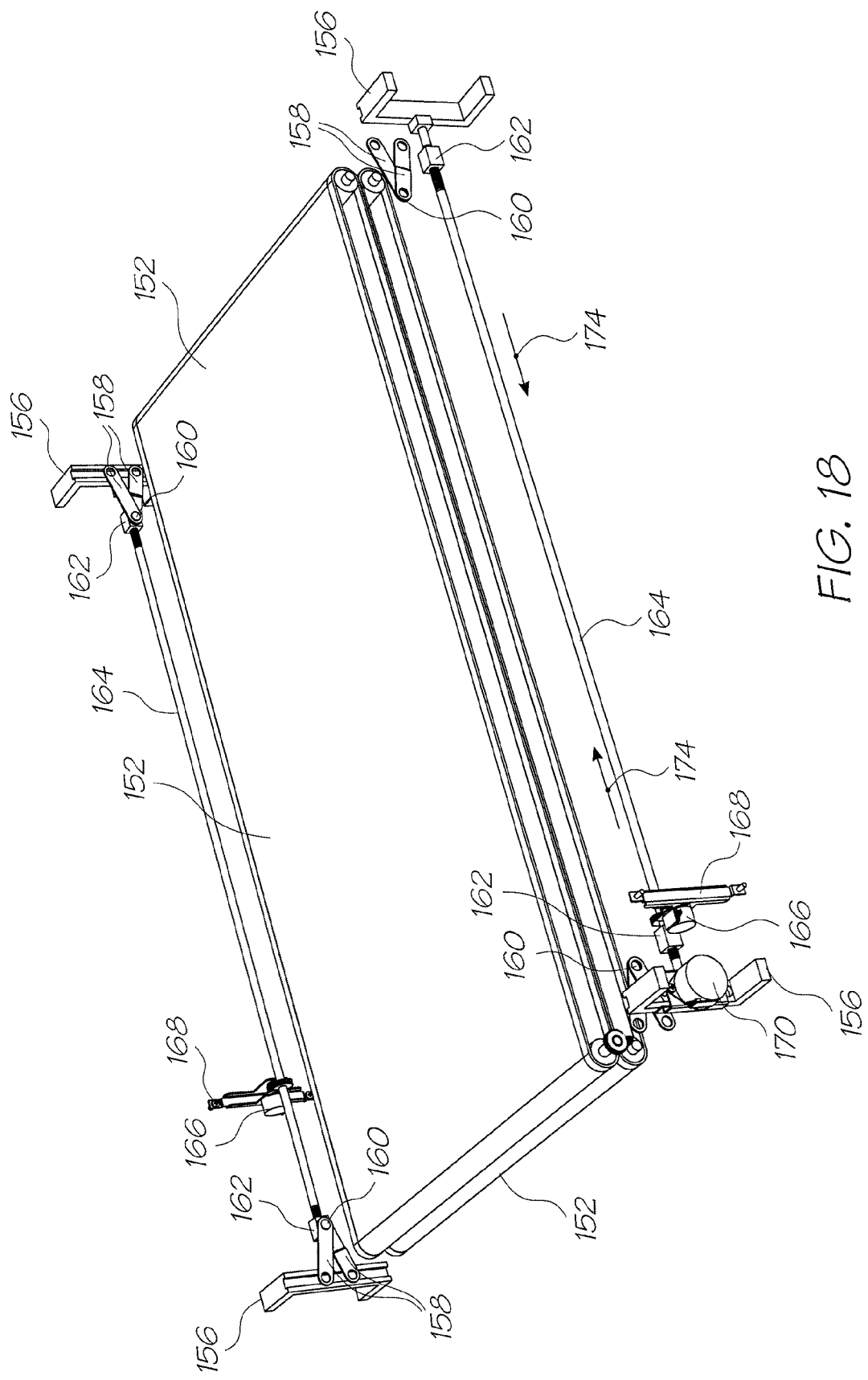
FIG. 18 shows a three dimensional, exploded view of the loading mechanism in its loading configuration.

The rollers 154 are driven by a motor 170 (FIG. 18).

Figure 8:
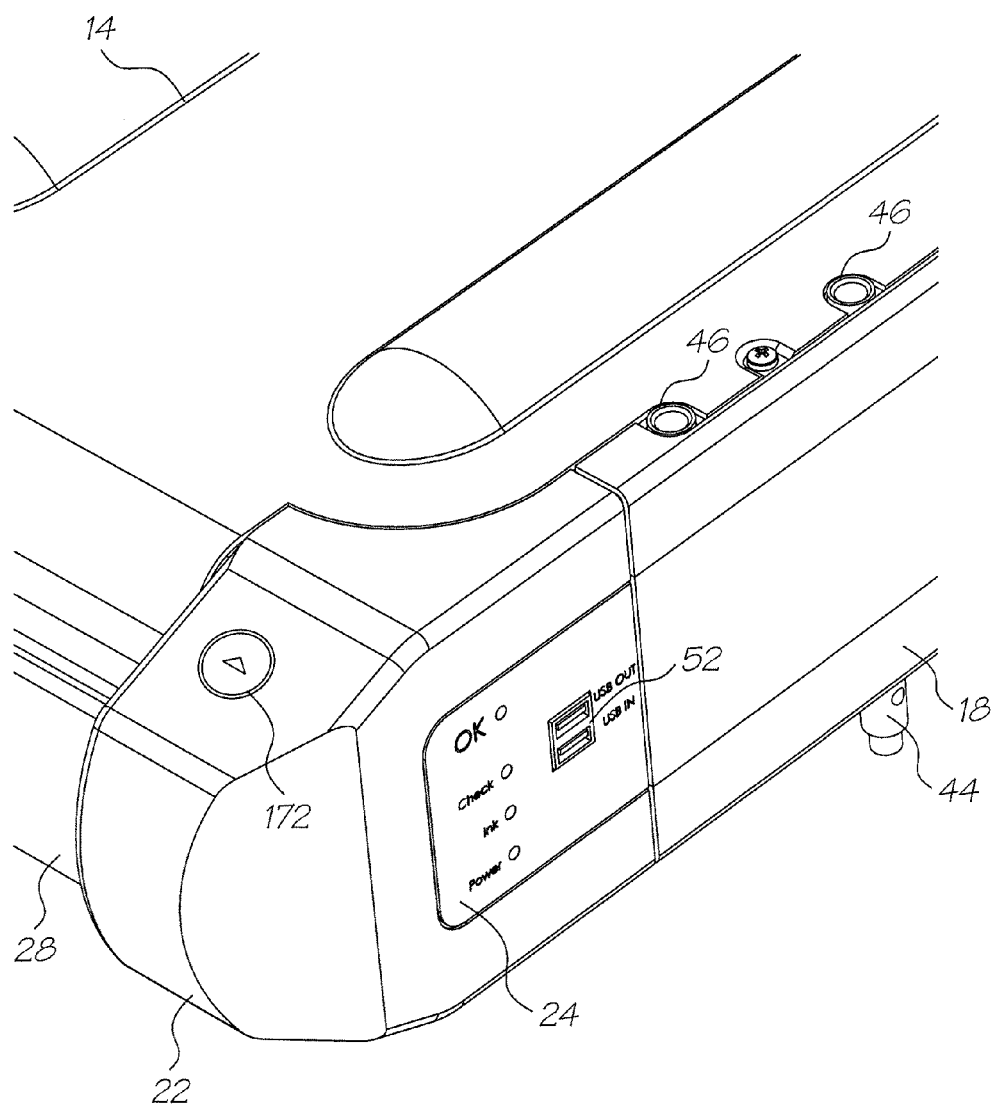
FIG. 8 shows a detailed, three dimensional view of part of the printer.

When it is desired to load paper 48 into the printer 10, the mechanism 150 is operated by a paper load button 172 (FIGS. 1 and 8). This causes the roller motor 170 to be activated as well as the motor 166. Rotation of the motor 166 causes the traverser blocks 162 to move in the direction of arrows 174 to bring the belts 152 into abutment with each other. A leading edge of the paper 48 is fed between the belts 152, is grabbed by the belts 152 and is fed through the printer 10 to exit through the exit roller assembly 86. Once the paper 48 has been loaded, the direction of the motor 166 is reversed so that the traverser blocks move in directions opposite to that of arrows 174 causing the belts 152 to move to the position shown in FIG. 16 of the drawings. Thus, during printing, the belts 152 are spaced from, and do not bear against, surfaces of the paper 48.

Accordingly, by means of the invention, a modular printer which can print at commercial printing speeds is provided for the printing of documents. Several modules can be arrayed in combination with inserting machines for published documents, such as magazines, with variable paper weights. In addition, print module redundancy allows paper splicing on a stopped web with no down time as the other printer modules in the stack 40 take up printing of the pages which would normally be printed by the out of operation printer 10.

Each printer 10 is provided with its document printing requirements over the USB2 communications network (or optional Ethernet) from a work station such as the console 54.

Also, due to memory capacity of each printer 10, tens of thousands of images and text blocks can be stored in memory allowing completely arbitrary selections on a page by page basis. This allows the printing of matter such as catalogues and magazines which are highly customised for each reader.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A printer comprising:
    a housing surrounding a frame and defining a first set of locking formations on a first surface thereof;
    a print engine housed within the housing, and including a pair of opposed print head assemblies for enabling double-sided printing to be effected upon print media passing there-between;
    a roller assembly mounted within the housing, and including a drive roller and a driven roller to transport the print media between the opposed print head assemblies; and
    a second set of locking formations extending from a second surface of the housing opposite the first surface, the second set of locking formations configured to engage with a first set of locking formations of another printer, thereby locking the printers together, wherein
    the first set of locking formations is offset from the second set of locking formations, whereby the printer and the another printer form a skewed stack.

2. A printer as claimed in claim 1, wherein the roller assembly further includes an exit roller assembly mounted within the housing, the exit roller assembly having a drive roller driven by a drive motor and a driven roller configured to transport printed print media out from the housing.

3. A printer as claimed in claim 1, wherein each print head assembly includes a pair of ink ejection printheads located proximal to a respective one of the rollers.

4. A printer as claimed in claim 3, wherein each printhead assembly further includes a pair of curved or J-shaped moldings, each molding defining ink galleries for supplying ink to a corresponding printead.

* * * * *